United States Patent

Kauffman et al.

[15] 3,646,456

[45] Feb. 29, 1972

[54] LOGARITHMIC AMPLIFIER

[72] Inventors: Eugene C. Kauffman, Portland; Larry R. Lockwood, McMinnville, both of Oreg.

[73] Assignee: Tektronix, Inc., Beaverton, Oreg.

[22] Filed: July 9, 1970

[21] Appl. No.: 53,466

[52] U.S. Cl. ................................328/145, 307/237, 307/229

[51] Int. Cl. ..........................................................G06g 7/24

[58] Field of Search ...................328/145, 142; 307/229, 237

[56] References Cited

UNITED STATES PATENTS 3,374,361 3/1968 Callis.....................................307/229

3,153,152 10/1964 Hoffman, Jr...........................307/229

*Primary Examiner*—Donald D. Forrer

*Assistant Examiner*—B. P. Davis

*Attorney*—Buckhorn, Blore, Klarquist and Sparkman

[57] ABSTRACT

A nonlinear amplifier circuit is described which may be used to provide a logarithmic amplifier. The amplifier circuit includes a plurality of similar stages connected in cascade, each stage including an operational amplifier and a limiter circuit connected in parallel with a portion of the input coupling resistance of such operational amplifier. The limit circuit is current-mode actuated and includes a pair of diodes connected in series opposition which are switched from a quiescent low-impedance state to a high-impedance state when the signal current exceeds a predetermined level. This causes an increase in the effective input coupling resistance and thereby reduces the gain $Z_f/Z_{in}$ of the operational amplifier stage to unity. As a result of cascade amplification, five amplifier stages are switched to unity gain in successive order from the output to the input of the amplifier circuit, thereby forming each of the segments of the logarithmic output.

11 Claims, 3 Drawing Figures

EUGENE C. KAUFFMAN
LARRY R. LOCKWOOD
INVENTORS.

BY

BUCKHORN, BLORE, KLARQUIST & SPARKMAN
ATTORNEYS

LOGARITHMIC AMPLIFIER

BACKGROUND OF THE INVENTION

The subject matter of the present invention relates generally to multiple-stage nonlinear amplifiers and, in particular, to logarithmic amplifiers employing a plurality of similar stages connected in cascade, each stage including an operational amplifier and a limiter connected across a portion of the input-coupling resistance of such operational amplifier. The gain of such stage is initially greater than unity and is reduced to unity upon switching of the limiter to a high-impedance state when the input signal exceeds a predetermined amplitude.

While the present logarithmic amplifier has other uses, it is of particular use as an amplifier of the signal processed in a spectrum analyzer. Such a spectrum analyzer separates the different frequency components of a signal and displays such signal components as frequency versus amplitude. The logarithmic amplifier enables a 60-decibel dynamic range of amplitude to be displayed on a linearly marked scale. Thus, such logarithmic amplifier produces an output signal which is a logarithmic function of an input signal in the intermediate frequency (IF) or video frequency range and compresses a wide range of input signal amplitude into a small output range logarithmically related to such input range.

Previous multiple-stage logarithmic amplifiers have employed operational amplifier stages, as shown in U.S. Pat. No. 3,483,475 of Mitchell, issued Dec. 9, 1969, but unlike the present invention, they do not employ diode limiters in parallel with the input coupling impedance of the operational amplifier. It is also known to employ a pair of diodes connected in series opposition to provide a temperature-compensated limiter, as shown in U.S. Pat. No. 3,197,627 of Lewis, issued July 27, 1965, but unlike the present invention, the limiters are connected in parallel to the input of a single amplifier stage. The Lewis circuit has the disadvantage over the present circuit that the bias current supplied through each of his parallel limiter stages is of a different value and must be precisely adjusted by a plurality of variable resistors in series therewith.

The logarithmic amplifier of the present invention has the advantage that each stage is identical and separate from the others, but uses the same DC bias so that such amplifier is of simple and inexpensive construction. In addition, the amplifier of the present invention has no inherent center frequency or frequency bandwidth limitations. Furthermore, such amplifier has inherent thermal stability and is relatively insensitive to variations in the characteristics of circuit components.

It is therefore, one object of the present invention to provide an improved nonlinear amplifier having a plurality of stages connected in cascade with a limiter connected in parallel with the input-coupling resistance of an operational amplifier in each stage.

Another object of the present invention is to provide such a nonlinear amplifier as a logarithmic amplifier of simple construction in which all of the stages are identical.

A further object of the invention is to provide such amplifier with the same DC bias current for each limiter so that such limiter switches at the same predetermined signal amplitude to reduce the gain of the associated operational amplifier to unity.

An additional object of the present invention is to provide such a logarithmic amplifier in which each limiter means is provided by a pair of diodes connected in series opposition for thermal stability.

Still another object of the invention is to provide such a logarithmic amplifier which is relatively insensitive to variations in the characteristics of circuit components and which has no inherent center frequency or frequency bandwidth response limitations.

BRIEF DESCRIPTION OF THE DRAWINGS

Other objects and advantages of the present invention will be apparent from the following detailed description of a preferred embodiment thereof and from the attached drawings of which

DESCRIPTION OF THE PREFERRED EMBODIMENT

Figure 1:
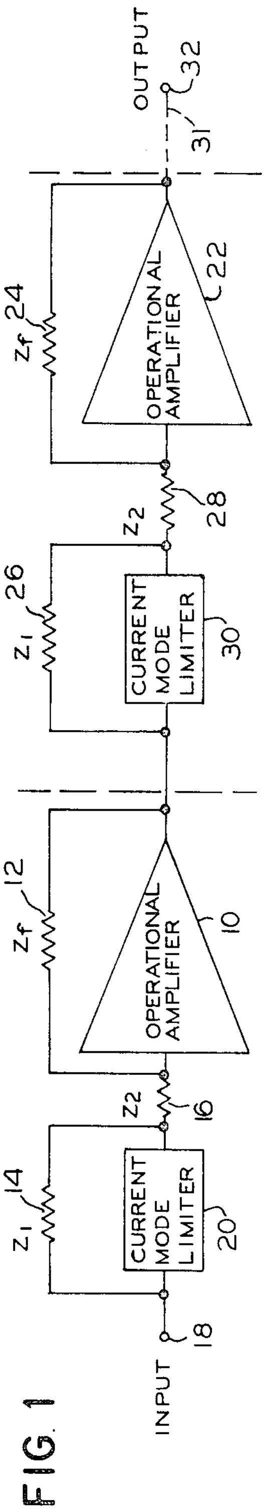
FIG. 1 is a block diagram of the nonlinear amplifier of the present invention.

As shown in FIG. 1, the nonlinear amplifier circuit of the present invention includes a plurality of similar stages connected in cascade. Each stage includes an operational amplifier and a limiter circuit connected in parallel with a portion of the input coupling impedance of such operational amplifier. Thus, a first stage of the nonlinear amplifier circuit of the present invention includes an operational amplifier formed by an inverter amplifier 10, a negative feedback resistance 12 connected between the output and input of such operational amplifier, and an input coupling resistance. The input coupling resistance includes two series-connected resistors 14 and 16 connected between the input of such amplifier and the input terminal 18 of the circuit, and forming the first input resistor $Z_1$ and the second input resistor $Z_2$, respectively. The operational amplifier is of a conventional type which, due to the high internal gain of the inverter amplifier 10 and the use of negative feedback, has an external gain substantially equal to the ratio $Z_f$/Zphd in of the feedback impedance $Z_f$ divided by the coupling resistance $Z_{in}$.

The present invention changes the gain of the operational amplifier by changing the value of the input coupling resistance $Z_{in}$ with a limiter means 20 connnected in parallel with $Z_1$ the first input coupling resistor 14. The limiter means may be a current mode operated limiter of the diode type. Thus, the limiter 20 is quiescently biased in low-impedance state $Z_L$ approximately equal to, or less than, the resistance of the first input resistor 14 so that the total parallel impedance of $Z_1$ and $Z_L$ is determined by the value of both. However, when the amplitude of the input signal applied to the limiter exceeds a predetermined value set by the DC bias current through the limiter diodes, such limiter switches to an extremely high-impedance state. Under this high-impedance condition, the total parallel impedance of $Z_1$ and $Z_L$ is substantially equal to the impedance $Z_1$ of the first input resistor 16. Thus, the total input coupling impedance $Z_{in}$ is then equal to the sum of the first input resistance $R_1$ and the second input resistance $R_2$.

The second stage also includes an operational amplifier formed by an inverter amplifier 22 having a negative feedback resistance 24 connected between the output and input thereof, and an input coupling resistance $Z_{in}$ including a pair of series-connected resistors 26 and 28 connected between the input of amplifier 22 and the output of amplifier 10. In addition, a second limiter means 30 is provided across the first input coupling resistor 26 and operates in a similar manner to limiter 20 previously described. It should be noted that limiter 30 is switched earlier than limiter 20 by the input signal applied to input terminal 18 since such input signal is amplified by the first stage including amplifier 10 before being applied to limiter 30. Thus, although the two limiters 20 and 30 are both provided with the same bias current and are switched at the same signal current level, the limiter 30 of the second stage is switched first due to the amplification of the preceding stage.

When the nonlinear amplifier of FIG. 1 is employed as a logarithmic amplifier, each of the stages have an identical gain characteristic which changes from a high-gain value greater than unity to a low-gain value of unity when the limiter of such stage is switched to a high-impedance state. As a result, each stage provides a different segment of a logarithmic curve representing the relationship between the input signal and the output signal of the logarithmic amplifier circuit. It should be noted that while only two stages are shown, a plurality of similar stages represented by the dashed line 31 are connected in cascade between the output of the second stage and an output terminal 32 of the amplifier circuit. Also, during its operation, the stages are switched from their high-gain condition to the unity gain condition in the reverse order of connection of such stages or in successive order from the output terminal 32 to the input terminal 18 of the logarithmic amplifier circuit.

The limiters 20 and 30 may be current-actuated switches, such as diodes, which are quiescently biased conducting to have a low impedance of about 800 ohms and are switched nonconducting when the input signal reverse biases such diodes into a high-impedance state which can be considered the infinite impedance of an open circuit. For temperature compensation, the current mode limiter can actually be in the form of a pair of diodes connected in series opposition.

The overall gain $G_T$ of the logarithmic amplifier is a product of the individual gains of the stages $G_T=G_1\times G_2\times G_3\times\ldots$ and each stage has a gain equal to the ratio of $Z_f/Z_{in}$. As indicated above, $Z_{in}=Z_2+X$, where $X$ is the total parallel resistance of $Z_1$ the first input resistor 16 or 28, and the resistance $Z_L$ of the limiter 20 or 30 is in its low-impedance state or $X$ is simply $Z_1$ in the high-impedance state of such limiter. When the limiter switches to its high-impedance condition, the gain of the stage changes to unity, so $Z_f/(Z_1+Z_2)=1$.

Figure 2:
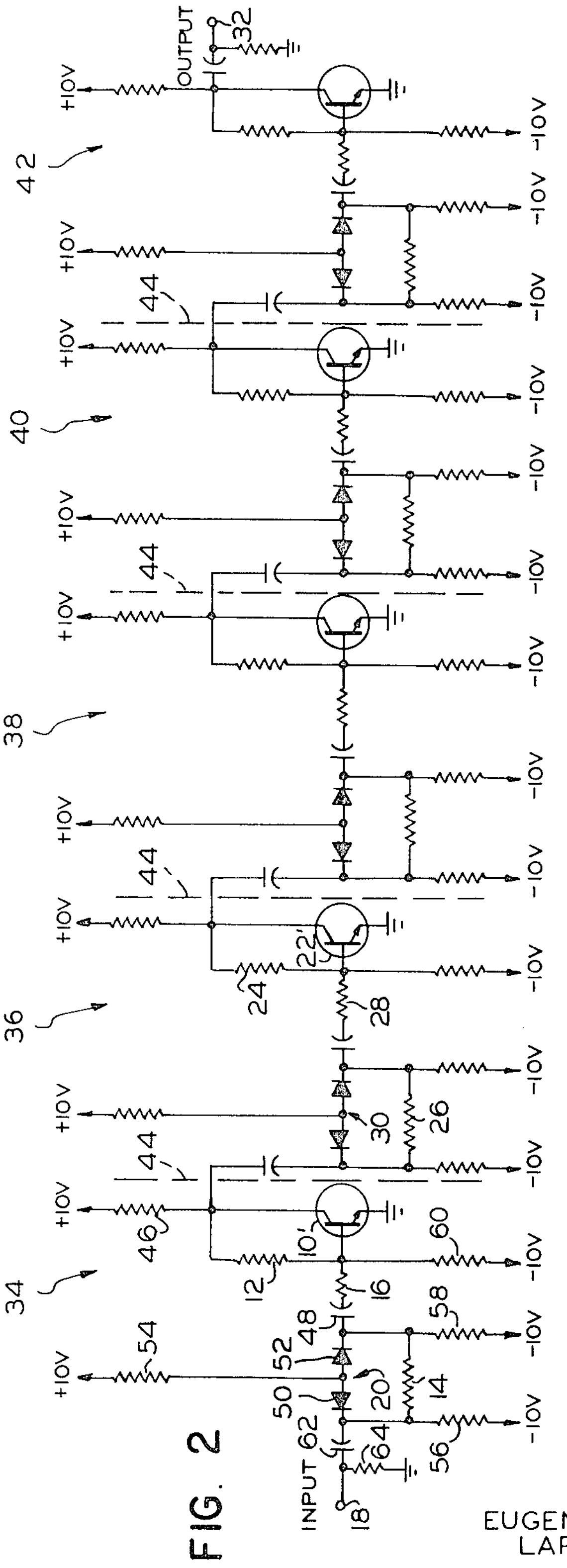
FIG. 2 is a schematic diagram of the electrical circuit of a logarithmic amplifier in accordance with one embodiment of the present invention.

One embodiment of the logarithmic amplifier of the present invention having five stages 34, 36, 38, 40, and 42, separated by vertical dashed lines 44, is shown in FIG. 2. Since each of the stages is identical, only the first stage 34 will be described in detail and is numbered in accordance with the corresponding elements of FIG. 1. The operational amplifier includes the inverter amplifier transistor 10' which is an NPN-type transistor having its emitter grounded and its collector connected to a source of +10 volts positive DC supply voltage through a load resistor 46 of 1.5 kilohms. A feedback resistor 12 of 4.02 kilohms is connected between the collector and base of transistor 10'. Input coupling resistors 14 and 16 of 3.83 kilohms and 200 ohms, respectively, are connected in series through an AC coupling capacitor 48 of 0.001 microfarad to the base of transistor 10'. The limiter 20 includes a pair of diodes 50, 52 connected in series opposition with the cathodes of such diodes connected to different ones of the opposite terminals of the first input resistor 16 and with the anodes of such diodes connected in common through bias resistor 54 of 50 ohms to a DC voltage source of +10 volts. Another pair of bias resistors 56 and 58 of 100 kilohms each are connected between a source of −10 volts negative DC supply voltage and the cathodes of diodes 50 and 52, respectively. As a result, the limiter diodes 50 and 52 are both forward-biased quiescently conducting with a DC bias current of about 100 microamperes each. The inverter amplifier transistor 10' is also biased conducting since its base is connected through a bias resistor 60 of 12 kilohms to a negative DC supply voltage of −10 volts.

Another AC coupling capacitor 62 of 0.001 microfarad is connected between the cathode of diode 50 and the input terminal 18 of the logarithmic amplifier circuit. This capacitor, as well as coupling capacitor 48, serve primarily as DC current blocking capacitors. An input shunt resistor 64 of 51 ohms is connected between the input terminal 18 and ground for impedance-matching purposes relative to the input signal source.

The logarithmic amplifier of FIG. 2 has a center frequency of 5 megahertz and a bandwidth of 1 megahertz. This amplifier is capable of operating over a dynamic amplitude range of 60 decibels where each of the five stages has a gain of four in the quiescent low-impedance state of the limiters and the overall gain of the logarithmic amplifier circuit is approximately 1,000. Thus, an input signal of 150 microvolts applied to input terminal 18 is produced as an output signal of 150 millivolts at output terminal 32. When the amplitude of the input voltage increased 1,000 times, or up to the limit of the 60-decibels dynamic range, the output voltage only increases about 24 times, and for an input voltage of 150 millivolts, the output voltage is 3.6 volts.

Figure 3:
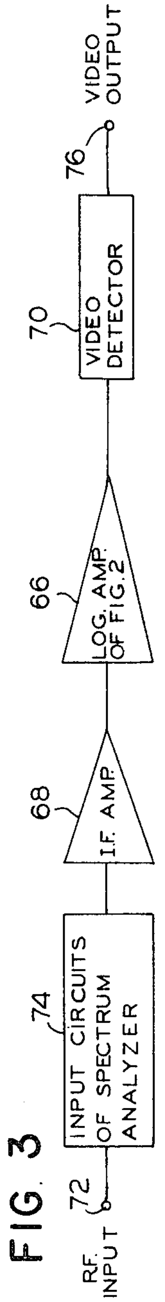
FIG. 3 is a simplified block diagram of a spectrum analyzer employing the logarithmic amplifier of FIG. 2.

As shown in FIG. 3, a spectrum analyzer of the type shown in U.S. Pat. No. 3,487,314 of Frisch may be provided with a logarithmic amplifier 66, in accordance with FIG. 2, between the output of an IF signal amplifier 68 and the input of a video signal detector circuit 70 for amplifying the signal being analyzed. Thus, a radiofrequency (RF) signal applied to an input terminal 72 of the spectrum analyzer input circuits 74 is converted to an IF signal which is transmitted through the logarithmic amplifier 66 to compress the amplitude range of such IF signal before it is transmitted to the video detector 70 and converted to a video frequency signal at the output terminal 76 of the spectrum analyzer. However, it is also possible to, instead, connect a logarithmic amplifier between video detector 70 and output terminal 76 to amplify the video signal.

It will be obvious to those having ordinary skill in the art that many changes may be made in the above-described details of the preferred embodiment of the present invention without departing from the spirit of the invention. Therefore, the scope of the present invention should only be determined by the following claims.

We claim:

1. A nonlinear amplifier circuit having a plurality of similar stages connected in cascade, with each stage having an operational amplifier including an inverter amplifier, a feedback impedance connected from the output to the input of said inverter amplifier, and an input-coupling impedance connected to the input of said inverter amplifier, in which the improvement comprises:

a plurality of limiter means each connecter in parallel with at least a first resistance portion of the input impedance of a different one of said stages for reducing the gain of said amplifier circuit in response to increases in the input signal amplitude, each of said limiter means changing from a low resistance value to a high resistance value to increase the effective input coupling resistance of the operational amplifier and reduce the stage gain when the amplitude of the input signal applied thereto exceeds predetermined level so that the plurality of stages are so operated in successive order from the output to the input of the amplifier circuit with each stage changing to a low-gain operation at different levels of the input signal to the amplifier circuit.

2. An amplifier circuit in accordance with claim 1 in which each one of the stages has the same greater-than-unity gain in the low-impedance condition of its limiter means and unity gain in the high-impedance condition of the limiter means to provide a logarithmic amplifier circuit.

3. An amplifier circuit in accordance with claim 2 in which the feedback impedance and the input impedance are resistances.

4. An amplifier circuit in accordance with claim 3 in which the limiter means is a current activated switch means.

5. An amplifier circuit in accordance with claim 4 in which the switch means includes a pair of diodes connected in series opposition across the first resistance portion of the input resistance, and a second resistance portion of said input resistance being connected between said first resistance and the input of the inverter amplifier.

6. An amplifier circuit in accordance with claim 5 in which the limiter means also includes a first bias resistor connected to the common connection terminals of said diodes and a pair of second bias resistors connected to the other terminals of different ones of said diodes.

7. An amplifier circuit in accordance with claim 6 which also includes a pair of coupling capacitors connected to different ones of the two opposite end terminals of said limiter means and in series with said diodes, one of said coupling capacitors being connected between said first and second resistance portions.

8. An amplifier circuit in accordance with claim 1 in which the inverter amplifier in each stage is a common emitter transistor amplifier.

9. A spectrum analyzer in which the improvement comprises means for transmitting the signal being analyzed through a logarithmic amplifier in accordance with claim 2.

10. A spectrum analyzer in accordance with claim 9 in which the logarithmic amplifier is connected between the output of an intermediate frequency amplifier and the input of a video detector circuit.

11. A nonlinear amplifier circuit having a plurality of similar stages connected in cascade, with each stage having an operational amplifier including an inverter amplifier, a feedback impedance connected from the output to the input of said inverter amplifier, and an input-coupling impedance connected in series between the input terminal of the stage and the input of said inverter amplifier, so that the gain of the operational amplifier is equal to the ratio of said feedback impedance divided by said input-coupling impedance, in which the improvement comprises:

a plurality of limiter means each connected in parallel with at least a first resistance portion of the input-coupling impedance of a different one of said stages for reducing the gain of said amplifier circuit in response to increases in the input signal amplitude, said limiter means each changing from a low resistance value to a high resistance value to increase the effective input-coupling resistance of the operational amplifier and reduce the stage gain when the amplitude of the input signal applied thereto exceeds a predetermined level so that the plurality of stages are so operated in successive order from the output to the input of the amplifier circuit with each stage changing to a low-gain operation at different levels of the input signal.

* * * * *

PO-1050
(5/69)

UNITED STATES PATENT OFFICE
CERTIFICATE OF CORRECTION

Patent No. 3,646,456 Dated February 29, 1972

Inventor(s) Eugene C. Kauffman and Larry R. Lockwood

It is certified that error appears in the above-identified patent and that said Letters Patent are hereby corrected as shown below:

In Column 2, line 28, "$Z_f$/Zphd in" should be --$Z_f/Z_{in}$--;

In Column 2, line 39, after "limiter" should be --10--;

In Column 4, Claim 1, line 28, "connecter" should be --connected--;

In Column 4, Claim 1, line 37, before "predetermined" should be --a--.

Signed and sealed this 27th day of June 1972.

(SEAL)
Attest:

EDWARD M.FLETCHER,JR.
Attesting Officer

ROBERT GOTTSCHALK
Commissioner of Patents